United States Patent
Cooper

(10) Patent No.: US 8,119,240 B2
(45) Date of Patent: Feb. 21, 2012

(54) METAL-FREE DIAMOND-LIKE-CARBON COATINGS

(75) Inventor: Clark V. Cooper, Glastonbury, CT (US)

(73) Assignee: United Technologies Corporation, Hartford, CT (US)

( * ) Notice: Subject to any disclaimer, the term of this patent is extended or adjusted under 35 U.S.C. 154(b) by 669 days.

(21) Appl. No.: 12/084,605

(22) PCT Filed: Dec. 2, 2005

(86) PCT No.: PCT/US2005/043757
§ 371 (c)(1),
(2), (4) Date: May 6, 2008

(87) PCT Pub. No.: WO2007/064332
PCT Pub. Date: Jun. 7, 2007

(65) Prior Publication Data
US 2009/0162677 A1    Jun. 25, 2009

(51) Int. Cl.
*B32B 9/00*    (2006.01)
*C23C 16/00*    (2006.01)
(52) U.S. Cl. .................. 428/408; 428/698; 204/192.16; 427/577; 384/492
(58) Field of Classification Search .............. 92/136; 192/18 R, 110 B, 111 R; 428/408, 698; 204/192.16; 384/445, 492; 427/577
See application file for complete search history.

(56) References Cited

U.S. PATENT DOCUMENTS

| | | | | | |
|---|---|---|---|---|---|
| 5,593,234 | A | * | 1/1997 | Liston | 428/698 |
| 5,705,262 | A | * | 1/1998 | Bou et al. | 428/408 |
| 6,056,443 | A | * | 5/2000 | Koike et al. | 427/577 |
| 6,740,393 | B1 | * | 5/2004 | Massler et al. | 428/698 |

FOREIGN PATENT DOCUMENTS

| | | | |
|---|---|---|---|
| EP | 724023 | * | 7/1996 |
| JP | 2003-314560 | * | 11/2003 |
| JP | 2004-137535 | * | 5/2004 |

OTHER PUBLICATIONS

Zhang et al "Margentron sputtered hard a-C coatings of very high toughness" Syrface & Caotings Tech. 167 (2003) p. 137-142.*

* cited by examiner

*Primary Examiner* — Archene Turner
(74) *Attorney, Agent, or Firm* — Carlson Gaskey & Olds, P.C.

(57) ABSTRACT

A coating (20) for a component of a power transmission system (10) and a method of coating a substrate is provided. The coating is substantially metal-free with a low hydrogen to carbon ratio. The method includes placing a graphite carbon target and the substrate in a magnetron sputtering chamber. The magnetron sputtering chamber is evacuated and filled with gas. The graphite carbon target is sputtered by the ionized inert and/or hydrogen gas so that the substrate is coated with a metal-free diamond-like-carbon coating.

40 Claims, 4 Drawing Sheets

METAL-FREE DIAMOND-LIKE-CARBON COATINGS

BACKGROUND OF THE INVENTION

1. Field of Invention

The present invention relates to diamond-like carbon coating compositions, and more particularly, to metal-free diamond-like-carbon coating compositions and methods of making and applying such coatings.

2. Description of the Related Art

Diamond-like carbon (DLC) films or coatings are hard and have low friction coefficients ($\mu$), especially against steel. Such films have numerous applications, especially in the fields of machine elements and tools.

DLC coatings, consisting of a highly cross-linked network of carbon atoms, typically have high compressive stress (typically several GPa). These high stress values lead to poor adhesion with the substrate, especially on steel and, therefore, limit their use in practical applications. The preparation and application of DLC coatings can be problematic. The most common method of preparation and application of DLC coatings is the use of radio frequency (r.f.) glow discharge of hydrocarbon gases with negatively self-biased substrates. However, the scaling up of this r.f. technique to industrially relevant dimensions, geometries and throughput requirements is often difficult, e.g., on the inner surface of journal sleeves.

Metal containing diamond-like carbon (Me-DLC) films or coatings have low metal content (atomic ratios of Me/C typically up to approximately 0.3), and have a lower compressive stress than a DLC coating (<1 GPa). The Me-DLC coatings consist of a network (continuous phase) of amorphous hydrogenated carbon (DLC) with incorporated or embedded metal carbides. The metal carbides typically have dimensions of several nanometers.

The friction coefficients of Me-DLC coatings are similar to those of DLC coatings. However, the abrasive wear resistance of Me-DLC coatings is generally thought to be lower than that of DLC coatings. At one time, the lowest abrasive wear rates reported for Me-DLC coatings were at least a factor of two lower than those reported for DLC coatings. Additionally, Me-DLC coatings typically require an intermediate adherence-promoting interlayer.

Different preparation and deposition techniques can be used for these coatings as discussed in an article entitled "Effect of target material on deposition and properties of metal-containing DLC (Me-DLC) coatings", by K. Bewilogua, C. V. Cooper, C. Specht, J. Schroder, R. Wittorf and M. Grischke, Surface & Coatings Technology 127, 224-232, Elsevier (2000), which is incorporated by reference herein in its entirety. The results of DLC coatings with high hydrogen contents are discussed in an article entitled "DLC based coatings prepared by reactive d.c. magnetron sputtering", by K. Bewilogua, R. Wittorf, H. Thomsen and M. Weber, Thin Solid Films, Vol. 447-448, pp. 142-147, 2004, which is incorporated by reference herein in its entirety.

Accordingly, there exists a need for a diamond-like-carbon coating composition having a superior hardness and low-residual stress. There is a further need for such coatings that possess high resistance to abrasion and superior adherence to substrates, e.g., metal substrates. There is an additional need for such coatings with improved resistance to failure in pure rolling compared to commercially available metal and hard diamond-like-carbon coating compositions.

SUMMARY OF THE INVENTION

In accordance with the present invention, a coating for a component of a power transmission system is provided that comprises an outer layer of a diamond-like-carbon composition, which is substantially metal-free. The outer layer is deposited on at least a portion of the component by a process of DC magnetron sputtering using an ionized inert gas and/or an ionized hydrocarbon gas.

In another aspect, a component of a power transmission system is provided that comprises a substrate and a coating on the substrate. The coating is a diamond-like-carbon coating which is substantially metal-free and has an atomic hydrogen to carbon ratio of less than about 0.2.

In another aspect, a power transmission system is provided comprising one or more components having a surface with a coating thereon. The coating is a diamond-like-carbon coating which is substantially metal-free and has an atomic hydrogen to carbon ratio of less than about 0.2.

In another aspect, a method for producing a component of a power transmission system is provided. The method includes, but is not limited to, the steps of: providing a substrate of the component; placing a graphitic carbon target and the substrate in a DC magnetron sputtering chamber; and sputtering the graphitic carbon target with an ionized inert gas and/or an ionized hydrocarbon gas, which together or individually may be used as the sputtering species so that the substrate is at least partially coated with a diamond-like-carbon coating that is substantially metal-free.

The inert gas can be chosen from the group consisting of argon, helium, xenon and combinations thereof. The hydrocarbon gas may be acetylene or methane, for example. Combinations of inert and hydrocarbon gases may also be used. The coating can further comprise an intermediate layer that promotes adhesion of the outer layer to the component. The intermediate layer may be a transition metal, a metalloid, or a crystalline or amorphous carbide or nitride that is based on the transition metal or metalloid. The substrate may be a surface of a journal bearing, a gear, a spline, a spring, a spring clutch, or an anti-friction bearing. The intermediate layer can be deposited on the substrate by the DC magnetron sputtering process.

The details of one or more embodiments of the invention are set forth in the accompanying drawings and the description below. Other features and advantages of the invention will be apparent from the description and drawings, and from the claims.

BRIEF DESCRIPTION OF THE DRAWINGS

Like reference numbers and designations in the various drawings indicate like elements.

DETAILED DESCRIPTION

Figure 1:
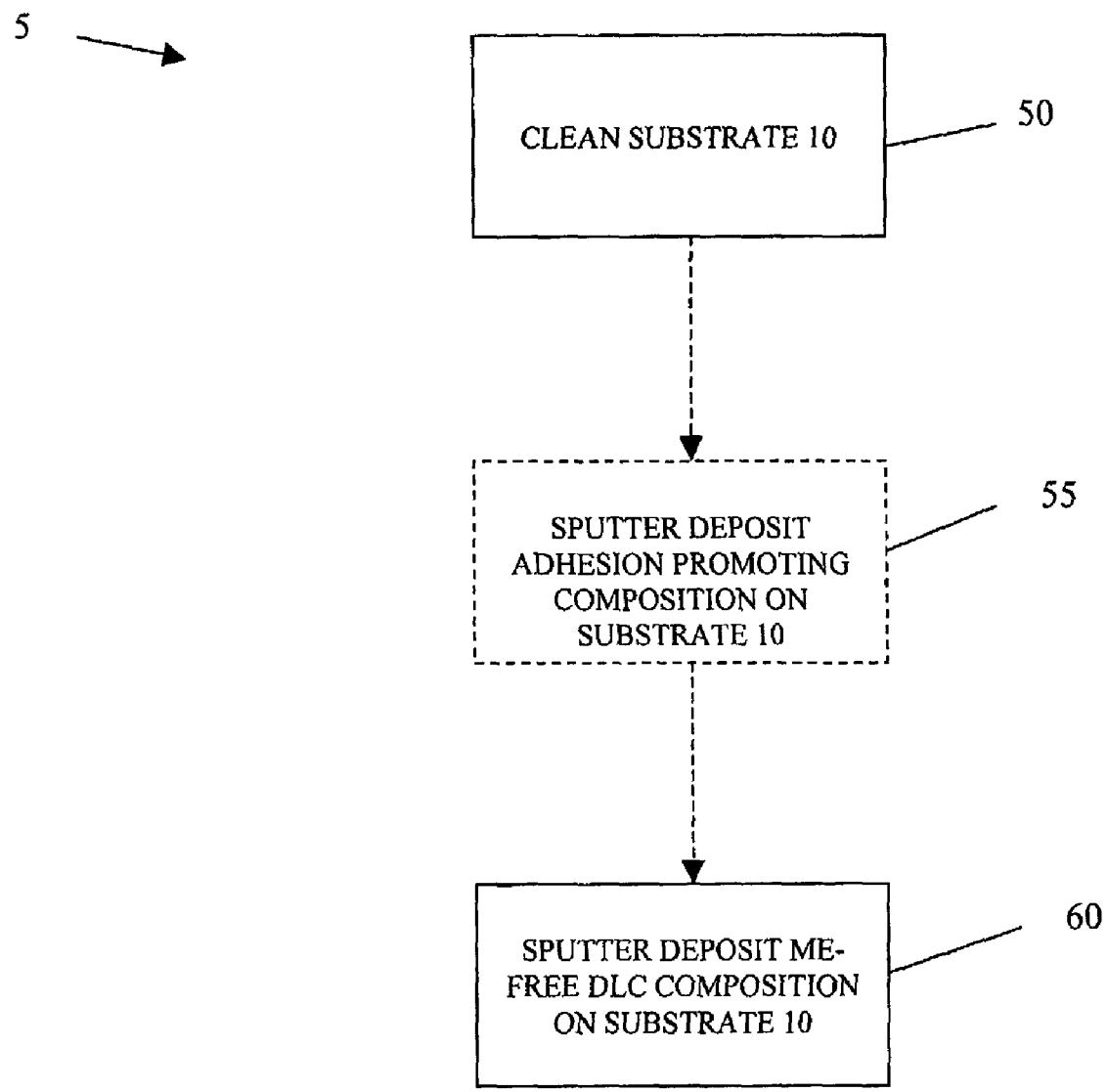
FIG. 1 illustrates an exemplary embodiment of a method according to the present disclosure of preparing a metal-free diamond-like-carbon coating.

Referring to FIG. 1, an exemplary embodiment of a method of preparing a diamond-like-carbon coating composition that is free or substantially free of metal ("Me-free-DLC") is generally illustrated and represented by reference numeral 5.

According to method 5, Me-free-DLC coatings are deposited via magnetron sputtering, in which targets of graphitic carbon are positioned in the interior of the deposition chamber, activated, and sputtered with ionized inert gas (i.e., argon, helium, xenon, etc.), or with a hydrocarbon gas (i.e., acetylene, methane, etc.), or with a combination of ionized inert gas and hydrocarbon gas. Deposition substrates 10, such as, for example, rolling-contact-fatigue rods, which can be composed of a through-hardened ferrous alloy, e.g., AISI M50, are placed into the deposition chamber and may be negatively biased using a direct current (DC) potential, preferably ranging from about −50 to −750 volts DC. The substrate 10 can be made of a number of different materials and/or combinations of materials, including, but not limited to, metals, such as, for example alloy steels that are selected for specific application to gears, bearings, and other power-transmission components; aluminum and its alloys; and titanium and its alloys.

The Me-free-DLC coatings can be prepared by reactive DC magnetron sputtering in an unbalanced mode. An HTC 1000/4 (ABS) coater (commercially available from Hauzer Techno Coating, Venlo, The Netherlands) is an example of a DC magnetron sputter that can coat substrate 10 according to method 5. Before initializing the deposition runs, the residual pressure in the vacuum chamber is set at less than about $10^{-3}$ Pascal (Pa). During the deposition runs, the total gas pressure in the vacuum chamber is preferably between about 0.3 Pa to 0.6 Pa. The substrates mentioned herein are supported within the vacuum chamber using substrate holders maintained at temperatures up to about 200° C. These substrate holders permit the substrate to be rotated at a rate of about twelve revolutions per minute of planetary, two-fold rotation. However, the present disclosure contemplates the use of other structures for positioning the substrates and other processing parameters in addition to those specifically identified. Throughout the entire process, the deposition rates are typically about 2 to 3 micrometers per hour.

The Me-free-DLC deposition process 5 generally comprises several steps. In step 50, the substrate 10 is cleaned. An argon etching process at a pressure of about 0.3 Pa can be used to clean the substrate 10. Argon gas is admitted to the chamber until the achievement of the desired gas flow rate and/or chamber pressure, generally about 300 standard cubic centimeters per minute (sccm) and 0.3 Pa, respectively, and ionized to produce Ar+ ions for sputter cleaning the substrate surface. The DC current applied to the graphitic carbon target is decreased until reaching zero. The vacuum chamber is then flushed out in preparation for the sputter deposition of the substrate coating.

In step 60, an outer or exterior layer 20 of the Me-free-DLC coating composition is sputter deposited upon the substrate 10. The DC current is applied gradually, that is, starting from zero and gradually increasing in intensity, to one or more targets composed of a graphitic carbon. In embodiments, a quantity of an inert gas or combination of inert gases, such as, for example, argon, helium and xenon, is introduced into the chamber and the process is continued until a Me-free-DLC coating of desired thickness is achieved. In an alternative embodiment, the inert gas is accompanied by a hydrocarbon gas which together sputter the graphitic carbon target and result in the deposition of the Me-free-DLC coating. In another alternative embodiment, a hydrocarbon gas is introduced into the chamber to sputter the graphitic carbon target and result in the deposition of the Me-free-DLC coating. These processing conditions result in the deposition of a Me-free-DLC coating containing an atomic hydrogen-to-carbon (H/C) ratio of less than about 0.25, and preferably less than about 0.20. For purposes of illustration and not to be taken in a limiting sense, the deposited exterior layer may possess a thickness of about 0.1 micrometer to about 10 micrometers.

Figure 2:
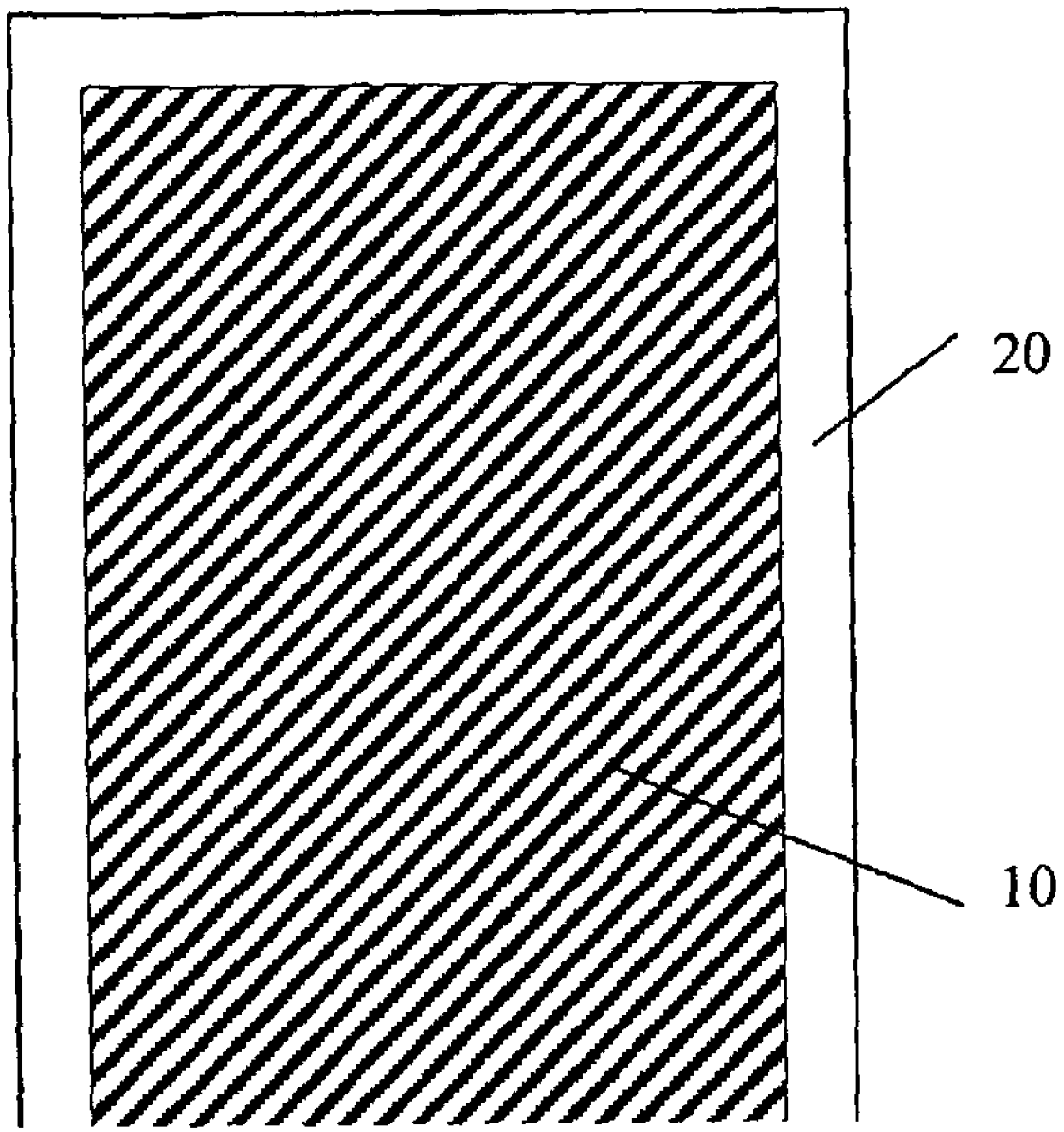
FIG. 2 is a representation of a metal-free diamond-like-carbon coating deposited upon a substrate comprising a rolling-contact-fatigue rod.

The resulting Me-free-DLC coating composition 20 deposited upon the substrate material 10 is illustrated in FIG. 2. The coating process is a reactive DC magnetron sputtering, a type of physical-vapor-deposition (PVD) process in which the graphitic carbon target is used as the sputtering target and the ionized inert gas and/or hydrocarbon gas is used as a sputtering species. The PVD process allows for the uniform coverage of the substrate 10 (often metallic). By way of example, the sputtering technique of the exemplary embodiment is performed on substrate 10 which may be a part or component of a larger device or system, a portion of such a part or component, a substrate connectable with such a part or component and/or any other material that would benefit from the application of the Me-free-DLC coatings described herein. Typically, the coating thickness is in the range from 0.5 to 5 micrometers, with thinner coatings being preferred for rolling contact, e.g., anti-friction bearings and thicker coatings being preferred for sliding contact, e.g., gears and sleeve bearings. However, the present disclosure contemplates various thicknesses of the coating deposited onto the substrate.

It has been found that the use of reactive magnetron sputtering to deposit the Me-free-DLC coatings eliminates the deficiencies of higher-hydrogen-content Me-DLC coatings, as well as DLC coatings that are metal-free but contain a higher concentration of hydrogen. The result is a Me-free-DLC coating that possesses each of the following desirable characteristics: high hardness; high resistance to abrasive wear; low coefficient of friction; excellent adherence between coating and the substrate either with or without an intermediate, adherence-promoting coating interlayer; high chemical inertness; low compressive residual stress; and resistance to attack by strong acids and bases. Each of these characteristics makes the application of this coating particularly useful for the mechanical components of a power transmission system, such as, for example, in a gas turbine or rotorcraft main gearbox. Additionally advantageous is the ability of this coating process to be scaled-up in size and throughput, its ability to deposit the coating onto complex and intricate external shapes, and its inherent ability to deposit the coating into inside diameters of cylinders, orifices of generic or unspecified geometry, and the like to a depth at least equal to the diameter.

Due to its numerous beneficial characteristics, sputter-deposited, Me-free-DLC coatings have a number of potential uses. For example, these coatings can be used on the working surfaces of journal bearings, their mating shaft journals, and other mechanical components, to enable operation under severe, often transient, conditions of lubrication-starved or lubrication-free operation. Such conditions are common in sleeve-type journal bearings during the transient periods of initial start-up and final shut-down of machines. Such machines may include, but are not limited to, gas turbine engines, integrated drive generators, auxiliary power units, and HVAC/R compressors. It is also foreseen that the sputter-deposited, Me-free-DLC coatings could be used on a number of other components. These components may include, but are not limited to, gears within power-transmissions and accessory gearboxes, splines, springs, spring clutches, and anti-friction bearings.

Referring again to FIG. 1, an intermediate layer 15 (shown in FIG. 3) composed of a transition adhesion-promoting composition, such as, for example, a transition metal, a metalloid, or a crystalline or amorphous carbide or nitride that is based on the transition metal or metalloid, can be sputter deposited upon the Ar-ion-etched substrates, as shown in phantom in step 55, prior to sputter depositing of the outer layer 20 (i.e., the Me-free-DLC coating). During this stage of the deposition process, the DC current applied to one or more targets composed of graphitic carbon is held constant at the target value. For this process step, argon gas is introduced into the chamber and held constant until the intermediate layer has grown to achieve its target thickness. As for the Ar-ion-etching stage, the flow rate and partial pressure of argon for this second process step are, respectively, approximately 300 sccm and 0.1-0.6 Pa, respectively. As these deposition conditions are maintained, the adhesion composition is sputter deposited onto the substrate surface until the achievement of a desired thickness. Typically, the deposited transition-adhesion intermediate layer possesses a thickness of at least about 10 nanometers (0.01 micrometers) and no more than about 2000 nanometers (2.0 micrometers) and preferably about 100 nanometers (0.1 micrometers) to 300 nanometers (0.3 micrometers).

Intermediate layer 15 is described in the exemplary embodiment as being sputter deposited using argon gas. The present disclosure contemplates the use of other gases and combinations of gases for the sputtering process, e.g., an inert gas, a carbonaceous source gas (hydrocarbon, such as methane or acetylene) or a combination of inert and hydrocarbon source gases. For example, a hydrocarbon gas, alone or mixed with an inert gas, could be used if the desired intermediate layer composition were a carbide, e.g., silicon carbide (or silicon-carbon solid solution) or titanium carbide (or titanium-carbon solid solution).

Figure 3:
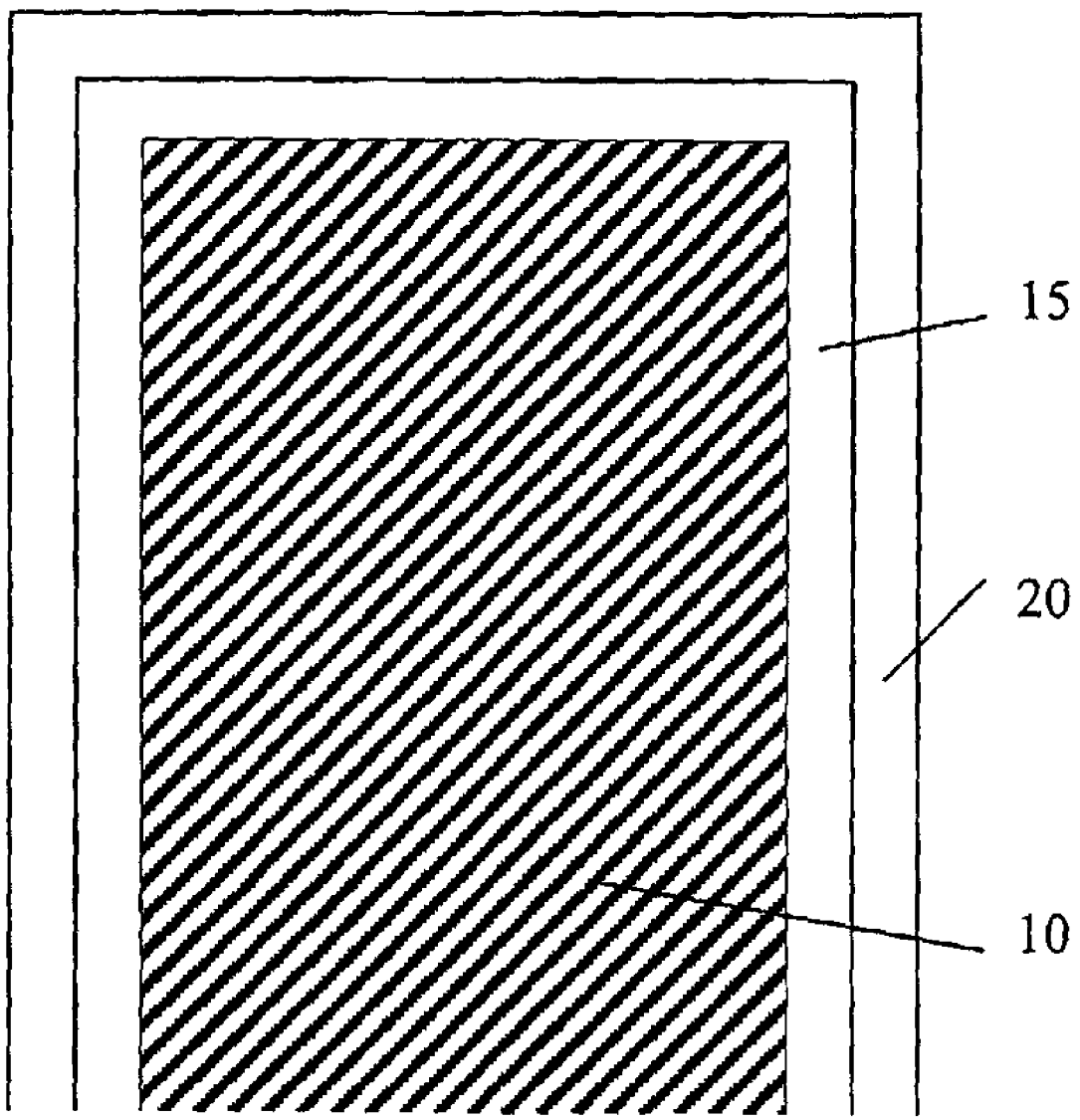
FIG. 3 is a representation of a metal-free diamond-like-carbon coating having an intermediate layer and an outer layer deposited upon a substrate comprising a rolling-contact-fatigue rod.

The resulting Me-free-DLC coating composition 20 deposited upon the substrate material 10 with the intermediate adhesion layer 15 is illustrated in FIG. 3. As depicted, a second surface, that is, the interior surface, of the exterior layer is in contact with the first surface or exterior surface of the intermediate layer whose second surface, that is, the interior surface, is in contact with the exterior surface of the substrate. The present disclosure describes the intermediate layer being deposited on the substrate 10 via the DC magnetron sputtering process. However, the present disclosure contemplates the intermediate layer being applied to the substrate 10 by other methods such as, for example, radio frequency glow discharge.

Figure 4:
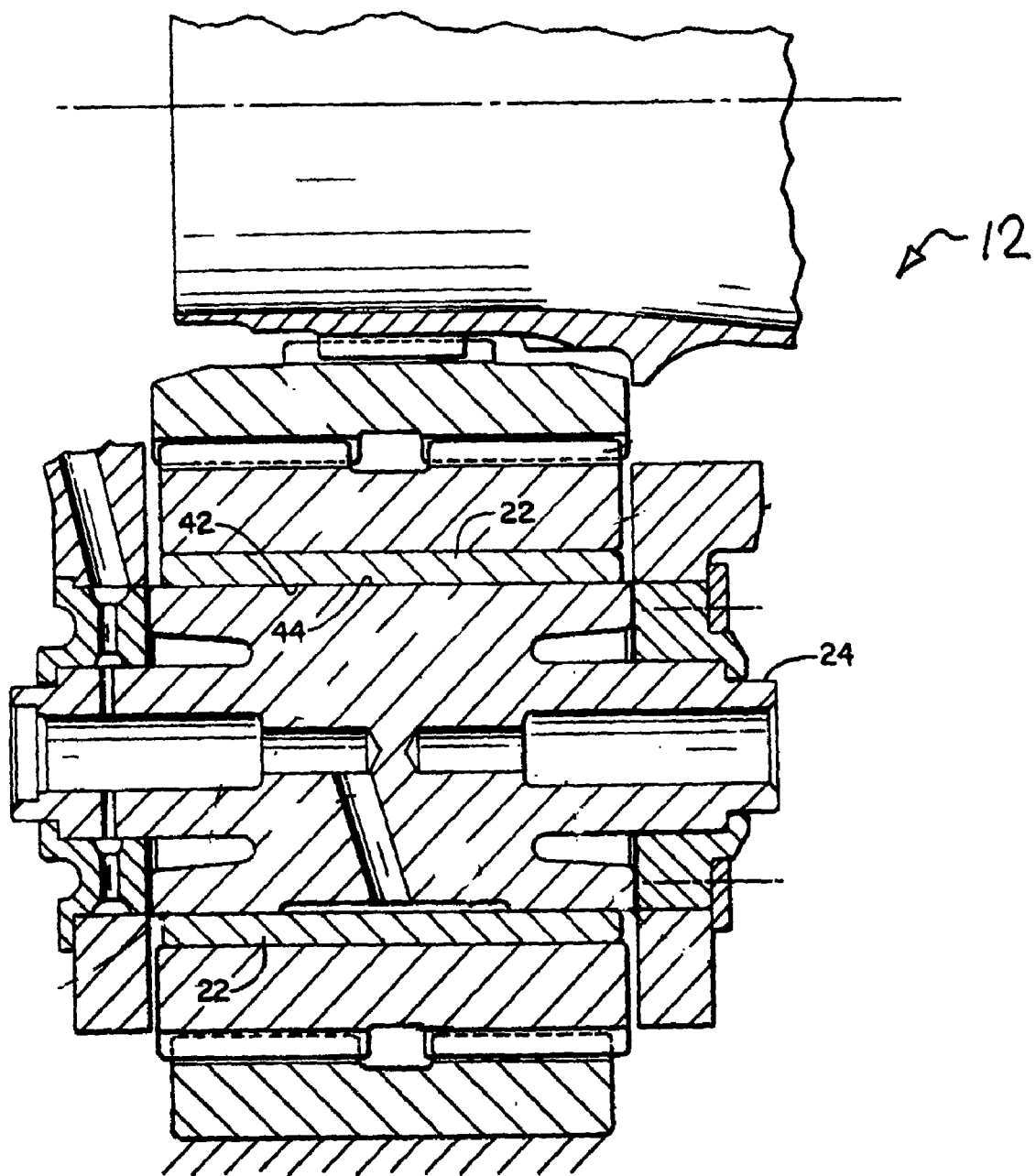
FIG. 4 is a representation of a portion of a transmission having interacting components with metal-free diamond-like-carbon coatings thereon.

Referring to FIG. 4, a portion of a power transmission system is illustrated and generally represented by reference numeral 12. The transmission system has a journal bearing 22 with an outer surface 42 and a pin 24 with an outer surface 44. Outer surfaces 42 and 44 have Me-free-DLC coating 20 deposited thereon. The interaction of journal bearing 22 and pin 24 will be in a lubricant and, at times, a lubricant-free environment. The use of coating 20 protects the journal bearing 22 and pin 24, and provides high hardness; high resistance to abrasive wear; low coefficient of friction; excellent adherence between the coating and the substrate either with or without an intermediate, adherence-promoting coating interlayer; high chemical inertness; low compressive residual stress; and resistance to attack by strong acids and bases. While the exemplary embodiment describes the Me-free-DLC coating 20 with respect to the journal bearing 22 and the pin 24, the present disclosure contemplates the use of the coating with other components of power transmission systems and/or systems that utilize moving and interacting parts. In a preferred embodiment, the components are metallic and can be, but are not limited to, gears within power-transmission and accessory gearboxes, splines, springs, spring clutches, and/or anti-friction (ball, roller, and hybrid) bearings. At least one of the components will have a surface in which the Me-free-DLC coating 20 is deposited thereon.

Although an exemplary embodiment of the present invention has been shown and described with reference to particular embodiments and applications thereof, it will be apparent to those having ordinary skill in the art that a number of changes, modifications, or alterations to the invention as described herein may be made, none of which depart from the spirit or scope of the present invention. All such changes, modifications, and alterations should therefore be seen as being within the scope of the present invention. Although the foregoing description of the present invention has been shown and described with reference to particular embodiments and applications thereof, it has been presented for purposes of illustration and description and is not intended to be exhaustive or to limit the invention to the particular embodiments and applications disclosed. It will be apparent to those having ordinary skill in the art that a number of changes, modifications, variations, or alterations to the invention as described herein may be made, none of which depart from the spirit or scope of the present invention. The particular embodiments and applications were chosen and described to provide the best illustration of the principles of the invention and its practical application to thereby enable one of ordinary skill in the art to utilize the invention in various embodiments and with various modifications as are suited to the particular use contemplated. All such changes, modifications, variations, and alterations should therefore be seen as being within the scope of the present invention as determined by the appended claims when interpreted in accordance with the breadth to which they are fairly, legally, and equitably entitled.

What is claimed is:

1. A coating for a component of a power transmission system comprising:
   an outer layer of a diamond-like-carbon composition substantially metal-free, wherein said outer layer is deposited on at least a portion of the component by a process of DC magnetron sputtering using at least one of an ionized inert gas and a hydrocarbon gas; and
   an intermediate layer located between the outer layer and the component, and the intermediate layer is a carbide or a nitride of a transition metal or metalloid.

2. The coating of claim 1, wherein said ionized inert gas is chosen from the group consisting of argon, helium, xenon and combinations thereof.

3. The coating of claim 1, wherein said hydrocarbon gas comprises at least one of acetylene and methane.

4. The coating of claim 1, wherein said DC magnetron sputtering uses a combination of said ionized inert gas and said hydrocarbon gas.

5. The coating of claim 1, wherein said diamond-like-carbon composition has an atomic hydrogen to carbon ratio of less than about 0.30.

6. The coating of claim 5, wherein said atomic hydrogen to carbon ratio is less than about 0.20.

7. The coating of claim 1, further comprising an intermediate layer that promotes adhesion of said outer layer to the component.

8. A component of a power transmission system comprising:
   a substrate and a coating on said substrate, wherein said coating is a diamond-like-carbon coating being substantially metal-free and having an atomic hydrogen to carbon ratio of less than about 0.30; and an intermediate layer located between the substrate and coating, and the intermediate layer is a carbide or a nitride of a transition metal or metalloid.

9. The component of claim 8, wherein said atomic hydrogen to carbon ratio is less than about 0.20.

10. The component of claim 8, wherein said coating is deposited on said substrate by a process of DC magnetron sputtering using at least one of an ionized inert gas and a hydrocarbon gas.

11. The coating of claim 10, wherein said hydrocarbon gas comprises at least one of acetylene and methane.

12. The component of claim 10, wherein said ionized inert gas is chosen from the group consisting of argon, helium, xenon and combinations thereof.

13. The component of claim 10, wherein said DC magnetron sputtering uses a combination of said ionized inert gas and said hydrocarbon gas.

14. The component of claim 8, further comprising an intermediate layer that promotes adhesion of said coating to said substrate.

15. The component of claim 8, wherein said substrate is a surface of a journal bearing, a gear, a spline, a spring, a spring clutch, or an anti-friction bearing.

16. A power transmission system comprising:
one or more components having a surface with a coating thereon, wherein said coating is a diamond-like-carbon coating being substantially metal-free and having an atomic hydrogen to carbon ratio of less than about 0.30; and
an intermediate layer located between the coating and the surface, and the intermediate layer is a carbide or a nitride of a transition metal or metalloid.

17. The system of claim 16, wherein said atomic hydrogen to carbon ratio is less than about 0.20.

18. The system of claim 16, wherein said coating is deposited on said surface by a process of DC magnetron sputtering using at least one of an ionized inert gas and a hydrocarbon gas.

19. The system of claim 18, wherein said DC magnetron sputtering uses a combination of said ionized inert gas and said hydrocarbon gas.

20. The system of claim 18, wherein said ionized inert gas is chosen from the group consisting of argon, helium, xenon and combinations thereof.

21. The system of claim 18, wherein said hydrocarbon gas comprises at least one of acetylene and methane.

22. The system of claim 16, wherein said one or more components has an intermediate layer that promotes adhesion of said coating to said one or more components.

23. The system of claim 16, wherein said one or more components is a journal bearing, a gear, a spline, a spring, a spring clutch, or an anti-friction bearing.

24. A method for producing a component of a power transmission system comprising:
providing a substrate of the component;
placing a graphitic carbon target and said substrate in a DC magnetron sputtering chamber;
in the chamber, forming an intermediate layer on the substrate, and the intermediate layer is a carbide or a nitride of a transition metal or metalloid; and
ionizing said graphitic carbon target with at least one of an inert gas and a hydrocarbon gas being used as the sputtering species so that said intermediate layer is at least partially coated with a diamond-like-carbon coating that is substantially metal-free.

25. The method of claim 24, wherein a combination of said ionized inert gas and said hydrocarbon gas are used as the sputter species.

26. The method of claim 24, wherein said inert gas is selected from the group consisting of argon, helium, xenon and any combinations thereof.

27. The method of claim 24, wherein said hydrocarbon gas comprises at least one of acetylene and methane.

28. The method of claim 24, wherein said diamond-like-carbon coating has an atomic hydrogen to carbon ratio of less than about 0.30.

29. The method of claim 28, wherein said atomic hydrogen to carbon ratio is less than about 0.20.

30. The method of claim 24, further comprising applying an intermediate layer to said substrate that promotes adhesion of said diamond-like-carbon coating to said substrate.

31. The method of claim 30, wherein said intermediate layer is deposited on said substrate by a DC magnetron sputtering process.

32. The method of claim 24, wherein said substrate is a surface of a journal bearing, a gear, a spline, a spring, a spring clutch, or an anti-friction bearing.

33. The coating of claim 1, wherein the intermediate layer is the carbide.

34. The coating of claim 1, wherein the intermediate layer is the nitride.

35. The coating of claim 1, wherein the intermediate layer is silicon carbide.

36. The coating of claim 1, wherein the intermediate layer is titanium carbide.

37. The method of claim 24, including sputter coating the intermediate layer onto the substrate.

38. The method of claim 37, including using a carbonaceous gas to form the intermediate layer as the carbide.

39. The method of claim 38, wherein the carbide is silicon carbide.

40. The method of claim 38, wherein the carbide is titanium carbide.

* * * * *